(12) United States Patent
Sekiguchi

(10) Patent No.: US 8,089,116 B2
(45) Date of Patent: Jan. 3, 2012

(54) FLOTOX-TYPE EEPROM AND METHOD FOR MANUFACTURING THE SAME

(75) Inventor: Yushi Sekiguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 98 days.

(21) Appl. No.: 12/596,216

(22) PCT Filed: Apr. 16, 2008

(86) PCT No.: PCT/JP2008/057442
§ 371 (c)(1),
(2), (4) Date: Oct. 16, 2009

(87) PCT Pub. No.: WO2008/129999
PCT Pub. Date: Oct. 30, 2008

(65) Prior Publication Data
US 2010/0084699 A1    Apr. 8, 2010

(30) Foreign Application Priority Data

Apr. 19, 2007 (JP) ................. 2007-110663

(51) Int. Cl.
*H01L 29/788* (2006.01)
*H01L 21/336* (2006.01)
(52) U.S. Cl. . 257/315; 257/321; 257/519; 257/E21.422; 257/E29.3; 438/257; 438/298
(58) Field of Classification Search ........... 257/313, 257/321, 519, E21.422, E21.557, E29.3; 438/257, 298
See application file for complete search history.

(56) References Cited

U.S. PATENT DOCUMENTS

| | | | |
|---|---|---|---|
| 5,208,173 A * | 5/1993 | Yamada et al. | 438/264 |
| 5,372,963 A | 12/1994 | Mori | |
| 5,894,147 A | 4/1999 | Cacharelis | |
| 6,156,609 A * | 12/2000 | Mirabel | 438/257 |
| 7,020,028 B2 * | 3/2006 | Seki et al. | 365/185.29 |
| 2005/0136597 A1 | 6/2005 | Shinada et al. | |

FOREIGN PATENT DOCUMENTS

| | | |
|---|---|---|
| EP | 0400483 A2 | 12/1990 |
| EP | 0513923 | 11/1992 |
| JP | 2-308572 A | 12/1990 |
| JP | 10-261724 | 9/1998 |
| JP | 2005-183763 A | 7/2005 |
| JP | 2006-028873 A | 2/2006 |
| JP | 2007-027406 A | 2/2007 |

* cited by examiner

*Primary Examiner* — Tuan N. Quach
(74) *Attorney, Agent, or Firm* — Rabin & Berdo, P.C.

(57) ABSTRACT

A FLOTOX-TYPE EEPROM of the invention has a configuration wherein an N region 25 as an impurity region formed under a tunnel window 12 and a channel stopper region 19 formed under a LOCOS oxide film 18 are spaced apart by a predetermined distance Y. Therefore, the tunnel window 12 does not sustain damage if an excessive voltage is applied to the tunnel window 12. As a result, the FLOTOX-TYPE EEPROM is adapted to limit the voltage applied to the tunnel window 12 and to reduce stress on the tunnel window 12 and can achieve an increased number of rewrites.

8 Claims, 2 Drawing Sheets

FLOTOX-TYPE EEPROM AND METHOD FOR MANUFACTURING THE SAME

CROSS REFERENCE TO RELATED APPLICATION

The present application is a national stage application, filed under 35 USC §371, of PCT application no. PCT/JP2008/057442 filed on Apr. 16, 2008.

TECHNICAL FIELD

The present invention relates to a FLOTOX-TYPE EEPROM.

BACKGROUND ARTS

Electrically writable and rewritable EEPROMs find extensive applications because it allows on-board rewrite and rewrite in units of pages or bytes. In recent years, therefore, manufacture methods for forming fine tunnel windows on FLOTOX-TYPE EEPROM have been proposed in Patent Documents 1 to 3 and the like.

Patent Document 1: Japanese Unexamined Patent Application Publication No. 2007-027406
Patent Document 2: Japanese Unexamined Patent Application Publication No. 2005-183763

DISCLOSURE OF THE INVENTION

Problems to be Solved by the Invention

The EEPROM has been decreased not only in chip size but also in memory cell size, achieving miniaturization. Particularly, a variety of forming methods for miniaturization as described above have been proposed regarding the tunnel window constituting a path for electrons injected into or extracted from a floating gate as a memory cell.

By the way, the EEPROM must be designed to withstand high voltages of 15 to 20V, for example, because the EEPROM uses FN tunneling current for writing data. Accordingly, peripheral circuits also need be designed to withstand high voltages. The peripheral circuits and EEPROM are normally formed in the same process flow and hence, are designed to withstand the same voltage level.

However, the tunnel window for allowing the FN tunneling current to pass through the EEPROM is formed of a thin oxide film having a thickness of about 70 to 100 Å. It is therefore desired that a junction formed under the tunnel window has a lower breakdown voltage than that of the peripheral circuits such that the tunnel window may not be damaged when an excessive voltage is applied to the tunnel window.

Although a breakdown voltage of a drain junction in the EEPROM is also required to withstand high voltages, it is desirable that the breakdown voltage of the drain junction is set to a voltage lower than that of a high breakdown voltage portion of the peripheral circuits. By setting such breakdown voltages, the drain junction is prevented from being subjected to an excessive voltage in cases where, for example, a high voltage is applied to the peripheral circuits for screening early failure. Therefore, the failure of EEPROM or the reduction of number of rewrites can be prevented.

Summary of the Invention

In view of the foregoing, the present invention has a primary object to provide a FLOTOX-TYPE EEPROM (FLOTOX EEPROM) which can prevent a problem that the excessive voltage is applied to the tunnel window to cause failure or to reduce the number of rewrites.

Another object of the invention is to provide a FLOTOX-TYPE EEPROM wherein the breakdown voltage of the drain junction and the breakdown voltage of the junction formed under the tunnel window are set to a voltage lower than that of the high breakdown voltage portion of the peripheral circuits such that the drain junction and tunnel window are prevented from being subjected to the excessive voltage when the high voltage is applied for screening the peripheral circuits.

A still another object of the invention is to provide a FLOTOX-TYPE EEPROM which reduces stress on the thin oxide film called the tunnel window by limiting the voltage applied to the oxide film and is increased in the number of rewrites.

Yet another object of the invention is to provide a manufacture method of FLOTOX-TYPE EEPROM wherein the breakdown voltages of the tunnel window and drain junction can be adjusted by taking simple manufacture steps.

Means for Solving the Problems

According to the invention for achieving the above objects, the FLOTOX-TYPE EEPROM which is formed at a surface layer region of a semiconductor substrate isolated by field oxide films (18) and which comprises a floating gate (11), a drain region (14) and a tunnel window (12) through which electrons pass during injection from the drain region into the floating gate or extraction from the floating gate, and in which impurity regions (20,25) are formed under the drain region and tunnel window and in which a channel stopper region is formed under the field oxide film, wherein the impurity region (20,25) and the channel stopper region (19) are formed at places spaced apart by a predetermined distance (X,Y) so as not to make contact with each other The alphanumeric characters in parentheses represent corresponding components and the like of an embodiment to be described hereinlater. However, the alphanumeric characters do not mean to limit the scope of the invention. Hereinafter, the same holds for this term.

According to this configuration, the impurity region (20, 25) and the channel stopper region (19) are formed at places spaced apart by the predetermined distance (X,Y) so as not to make contact with each other. Thus, the configuration is adapted for high breakdown voltage design such that the EEPROM can withstand high voltages of 15 to 20V, for example, applied thereto for passing the FN tunneling current during data writing.

Furthermore, when an overvoltage is applied to the EEPROM, damage on the tunnel window (12) can be reduced by preventing the application of a voltage above a certain level to the tunnel window (12) and passing the current to the semiconductor substrate (17) based on the level of the applied voltage. Therefore, the EEPROM can be increased in the number of rewrites.

The FLOTOX-TYPE EEPROM according to the invention may also be configured such that the EEPROM comprises a cell transistor including the floating gate (11) and a select transistor including the drain region (14) and operative to select a floating gate (11) to be subjected to electron injection and extraction, and that in a cross section of a region including the tunnel window (12) and a cross section of the drain region (14) taken in a direction orthogonal to a direction from the cell transistor toward the select transistor, the impurity region (20,25) and the channel stopper region (19) are formed at places spaced apart by a predetermined distance (X,Y).

In a conventional EEPROM, the impurity region (20,25) and the channel stopper region (19) are in contact as seen in the above cross section direction and hence, the breakdown voltage thereof is dependent only upon impurity concentration. If the impurity concentration is changed to adjust the breakdown voltage, a field turnover voltage of an isolated area is changed. Therefore, the adjustment of breakdown voltage is difficult and subjected to certain restrictions. However, the above-described configuration is made to ensure that a target voltage is applied to the tunnel window (12) even if the value of program voltage applied by the peripheral circuits is varied. The configuration can adjust the damage on the tunnel window (12) and achieve the original goal of EEPROM, namely the increase of the number of rewrites.

The invention is a manufacture method of the above FLOTOX-TYPE EEPROM which is characterized in that the distance (X,Y) between the impurity region and the channel stopper region (19) is provided by taking steps including: (a) forming the channel stopper region by light exposure and implantation, and (b) forming the impurity region by light exposure and implantation, and that the distance between the impurity region and the channel stopper region is adjusted to the predetermined distance by adjusting dimensions of resists (23) subjected to the light exposure of the above steps (a) and (b).

In a case where the channel stopper region (19) and the impurity region (20,25) are formed on the semiconductor substrate (17) isolated by the field oxides (18) formed using a common manufacturing process, the above-described arrangement allows the junction breakdown voltage of the drain region (14) and the junction breakdown voltage of the impurity region under the tunnel window to be easily adjusted by adjusting the dimensions of the resists during the light exposure and the dosages of ions injected during the formation of the channel stopper region and the impurity region. Thus, the FLOTOX-TYPE EEPROM having the desired junction breakdown voltages can be manufactured.

The above and other objects, features and effects of the present invention will become apparent from the following description of the embodiment thereof made with reference to the accompanying drawings.

DESCRIPTION OF REFERENCE NUMERALS

Figure 1A:
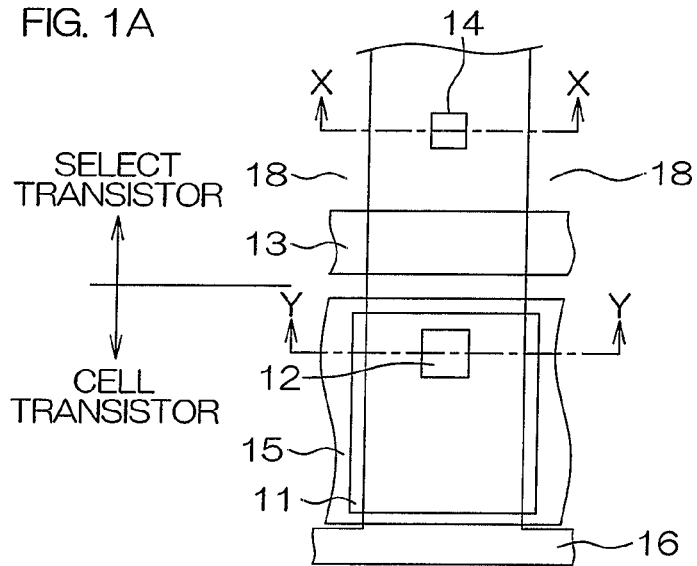
FIG. 1A A schematic plan view for explaining a configuration of a FLOTOX-TYPE EEPROM according to an embodiment of the invention.

11: Floating gate
12: Tunnel window
13: Select gate
14: Drain
17: Semiconductor substrate
18: Field oxide film (LOCOS oxide film)
19: Channel stopper region
20,25: Impurity region (N region)
23: Resist

BEST MODES FOR CARRYING OUT THE INVENTION

An embodiment of the invention will be described in detail as below with reference to the accompanying drawings.

Figure 1B:
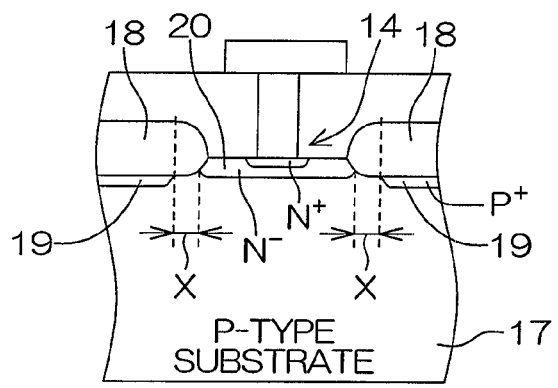
FIG. 1B A schematic sectional view for explaining the configuration of the FLOTOX-TYPE EEPROM according to the embodiment of the invention.
Figure 1C:
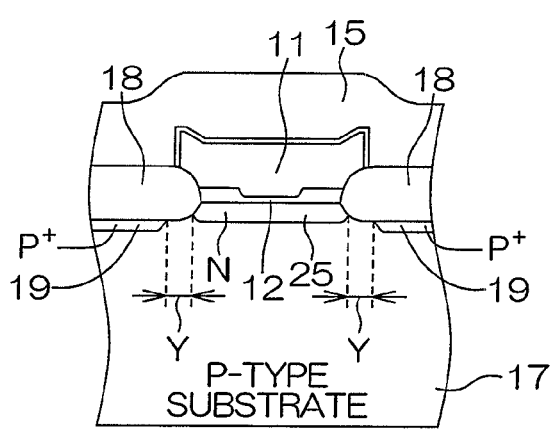
FIG. 1C A schematic sectional view for explaining the configuration of the FLOTOX-TYPE EEPROM according to the embodiment of the invention.

FIG. 1A is a schematic plan view for explaining a configuration of a FLOTOX-TYPE EEPROM according to an embodiment of the invention. FIG. 1B is a schematic sectional view taken along the line X-X in FIG. 1A, showing a cross section structure of the FLOTOX-TYPE EEPROM. FIG. 1C is a schematic sectional view taken along the line Y-Y in FIG. 1A, showing the cross section structure.

In FIG. 1A, FIG. 1B and FIG. 1C, a floating gate is indicated at 11. Indicated at 12 is a tunnel window provided in association with the floating gate 11 and defining a path of electrons to the floating gate 11. Indicated at 13 is a select gate provided in correspondence to the floating gate 11. A drain region is indicated at 14. The select gate 13 and the drain region 14 belong to a select transistor.

A control gate laid over the floating gate 11 is indicated at 15, while indicated at 16 is a source. The floating gate 11, control gate 15 and source 16 are components of a cell transistor.

These select transistor and cell transistor are disposed at a region isolated by LOCOS oxide films 18 as field oxide films formed at a surface layer region of a semiconductor substrate 17. In this embodiment, the semiconductor substrate 17 is a P-type substrate and a P+ channel stopper region 19 is formed under the LOCOS oxide film 18.

N regions 20,25 as impurity regions are formed under the tunnel window 12 and in the drain region 14. It is noted that the N region 20 under the drain region 14 includes an N− region and an N+ region formed therein.

This embodiment is characterized in that in a cross section taken in a direction orthogonal to a direction from the cell transistor toward the select transistor, as shown in FIG. 1B, the N region 20 formed in the drain region 14 and the channel stopper region 19 formed under the LOCOS oxide film 18 are spaced apart by a predetermined distance X so as not to make contact with each other.

As shown in FIG. 1C, the embodiment is further characterized in that the N region 25 formed under the tunnel window 12 and the channel stopper region 19 formed under the LOCOS oxide film 18 are spaced apart by a predetermined distance Y. It is noted that the predetermined distance X and the predetermined distance Y may be X=Y or X≠Y, provided that X≠0 and Y≠0.

In this manner, the N region 20 formed in the drain region 14 and the channel stopper region 19 are spaced apart by the predetermined distance X thereby making it easy to design the breakdown voltage of the drain junction to be as high as required for the EEPROM within a range lower than a breakdown voltage of a high breakdown voltage portion of peripheral circuits. In other words, the breakdown voltage of the drain region 14 (drain junction) can be relatively freely set to a desired level by adjusting the distance X between the N region formed in the drain region 14 and the channel stopper region 19 to the predetermined distance. On this occasion, it is desirable to adjust the concentrations of the N region and channel stopper region 19 along with the adjustment of the distance X.

Similarly, the N region 25 formed under the tunnel window 12 and the channel stopper region 19 are also formed at places spaced apart by the predetermined distance Y. This allows the breakdown voltage of the tunnel window 12 to be adjusted to a given level. In addition, the tunnel window can be designed such that when an excessively high voltage is applied to the tunnel window 12, such a high voltage is passed to the semiconductor substrate 17. Hence, the tunnel window 12 is prevented from being subjected to the excessively high voltage.

When the N region 25 under the tunnel window 12 and the channel stopper region 19 proximate thereto are formed, the breakdown voltage at a portion of the tunnel window 12 can be set with a certain degree of freedom by adjusting the above distance Y and the concentrations of the regions 25, 19.

Figure 2A:
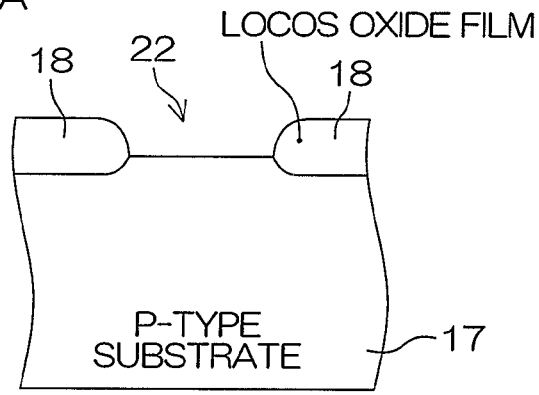
FIG. 2A A flowchart showing a part of a manufacturing process of the FLOTOX-TYPE EEPROM according to another embodiment of the invention.
Figure 2B:
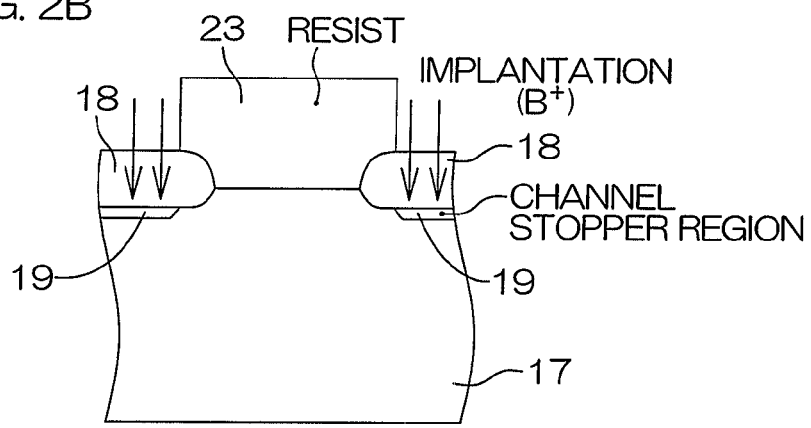
FIG. 2B A flow chart showing a part of the manufacturing process of the FLOTOX-TYPE EEPROM according to the embodiment of the invention.
Figure 2C:
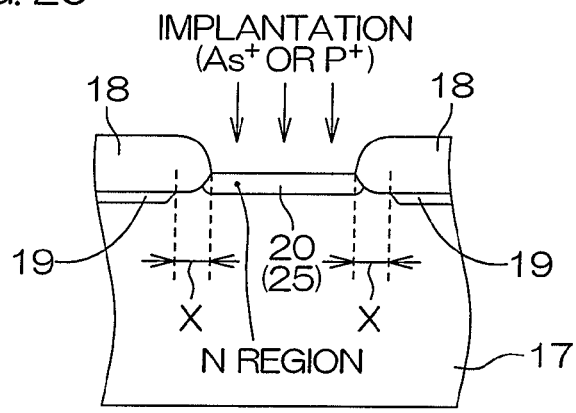
FIG. 2C A flow chart showing a part of the manufacturing process of the FLOTOX-TYPE EEPROM according to the embodiment of the invention.

FIG. 2A to FIG. 2C are flowcharts each showing a part of a manufacturing process of the FLOTOX-TYPE EEPROM according to another embodiment of the invention.

As shown in FIG. 2A, the LOCOS oxide films 18 are formed on the surface layer region of the P-type semiconductor substrate 17 by using a common process flow, so as to form an isolated region 22.

Subsequently, as shown in FIG. 2B, a resist 23 is formed to cover the region 22 and exposed to light. At this time, a range of the resist to be removed by the light exposure is adjusted such that the resist 23 covering the region 22 may also cover an edge portion of the LOCOS oxide film 18. Thus, the predetermined distance X (or Y) can be provided between the channel stopper region 19 and the N region 20(25), as will be described hereinlater.

Subsequently, an implantation step is performed for forming the channel stopper region 19 under a part of the LOCOS oxide film 18 that is not covered by the resist 23. Ions injected by the implantation step are, for example, boron (B+).

As shown in FIG. 2B, the resist 23 is removed after the formation of the channel stopper region 19. As shown in FIG. 2C, an implantation step is performed using the LOCOS oxide film 18 as a resist. The injected ions may be, for example, arsenic (As+) or phosphorus (P).

The junction breakdown voltage of the N region 20(25) to be formed can also be adjusted by adjusting the dosage of ions injected in the implantation step shown in FIG. 2B and FIG. 2C.

After the N region 20(25) is formed as shown in FIG. 2C, the common manufacturing process of EEPROM is carried out.

The invention is not limited to the teachings of the embodiments described above and various changes or modifications may be made thereto within the scope of the claims thereof.

The present application is based on Japanese Patent Application No. 2007-110663 filed with Japanese Patent Office on Apr. 19, 2007, and the whole disclosure thereof is incorporated herein by reference.

The invention claimed is:

1. A FLOTOX EEPROM which is formed at a surface layer region of a semiconductor substrate isolated by field oxide films, the EEPROM comprising:
    a floating gate;
    a drain region;
    a tunnel window through which electrons pass during injection from the drain region into the floating gate or extraction from the floating gate; and
    an impurity region that is formed under the drain region and tunnel window respectively and in which a channel stopper region is formed under the field oxide film;
    the impurity region and the channel stopper region being formed at places spaced apart by a predetermined distance so as not to contact each other.

2. The FLOTOX EEPROM according to claim 1, wherein the EEPROM further comprises a cell transistor including the floating gate and a select transistor including the drain region and operative to select a floating gate to be subjected to electron injection and extraction; and
    wherein in a cross section of a region including the tunnel window and a cross section of the drain region taken in a direction orthogonal to a direction from the cell transistor toward the select transistor, the impurity region and the channel stopper region are formed at places spaced apart by a predetermined distance.

3. A manufacture method of the FLOTOX EEPROM according to claim 2, wherein the distance between the impurity region and the channel stopper region is provided by taking steps including:
(1) forming the channel stopper region by light exposure and implantation, and
(2) forming the impurity region by light exposure and implantation,
    wherein the distance between the impurity region and the channel stopper region is adjusted to the predetermined distance by adjusting dimensions of resists subjected to the light exposure of the above steps (1) and (2).

4. A manufacture method of the FLOTOX EEPROM according to claim 1, wherein the distance between the impurity region and the channel stopper region is provided by taking steps including:
(1) forming the channel stopper region by light exposure and implantation, and
(2) forming the impurity region by light exposure and implantation,
    wherein the distance between the impurity region and the channel stopper region is adjusted to the predetermined distance by adjusting dimensions of resists subjected to the light exposure of the above steps (1) and (2).

5. The FLOTOX EEPROM according to claim 1, wherein the surface layer region of the semiconductor substrate of a first conductive type is the same conductive type of the channel stopper region that exists between the impurity region and the channel stopper region.

6. The FLOTOX EEPROM according to claim 1, wherein the channel stopper region is formed from underneath the field oxide film that is spaced apart by a predetermined distance from an edge of the field oxide film.

7. The FLOTOX EEPROM according to claim 1, wherein the tunnel window is formed apart from an edge of the field oxide film.

8. The FLOTOX EEPROM according to claim 7, wherein a region of the tunnel window is smaller than the impurity region.

* * * * *